(12) United States Patent
Davis

(10) Patent No.: US 10,500,472 B1
(45) Date of Patent: Dec. 10, 2019

(54) ATHLETIC TOUCH-SENSING EQUIPMENT

(71) Applicant: Teyvion Davis, Jacksonville, FL (US)

(72) Inventor: Teyvion Davis, Jacksonville, FL (US)

( * ) Notice: Subject to any disclaimer, the term of this patent is extended or adjusted under 35 U.S.C. 154(b) by 0 days.

(21) Appl. No.: 15/872,038

(22) Filed: Jan. 16, 2018

(51) Int. Cl.
- H05K 1/03 (2006.01)
- A63B 71/06 (2006.01)
- G08B 21/18 (2006.01)
- H05K 1/09 (2006.01)

(52) U.S. Cl.
CPC .......... *A63B 71/0605* (2013.01); *G08B 21/18* (2013.01); *H05K 1/038* (2013.01); *H05K 1/092* (2013.01); *H05K 2201/10022* (2013.01); *H05K 2201/10037* (2013.01); *H05K 2201/10174* (2013.01)

(58) Field of Classification Search
CPC .... G08B 23/00; G08B 21/18; A63B 71/0605; H05K 1/038; H05K 1/092
USPC .......................................................... 340/660
See application file for complete search history.

(56) References Cited

U.S. PATENT DOCUMENTS

| | | | |
|---|---|---|---|
| 6,997,459 B2 | 2/2006 | von Goeben | |
| D607,347 S | 1/2010 | Goh | |
| 7,891,231 B2 * | 2/2011 | Song | A63B 69/004 73/12.09 |
| 8,172,722 B2 | 5/2012 | Molyneux | |
| 8,477,046 B2 | 7/2013 | Alonso | |
| 2002/0037759 A1 * | 3/2002 | Aldridge | A63B 69/004 463/1 |
| 2006/0161356 A1 | 7/2006 | Desroses | |
| 2017/0056748 A1 * | 3/2017 | Crawford | A63B 71/06 |
| 2017/0120143 A1 | 5/2017 | Ferrusi | |
| 2017/0203184 A1 * | 7/2017 | Thompson | A63B 71/06 |
| 2018/0067516 A1 * | 3/2018 | Longinotti-Buitoni | G06F 1/163 |

FOREIGN PATENT DOCUMENTS

WO 2017039893 A 3/2017

\* cited by examiner

*Primary Examiner* — Kerri L McNally
(74) *Attorney, Agent, or Firm* — Kyle A. Fletcher, Esq.

(57) ABSTRACT

The athletic touch-sensing equipment: 1) senses when contact is made between the first competitor and a second competitor; and, 2) detects when a threshold of contact is exceeded and generates an audio alarm and a visual alarm to indicate that contact is detected. The athletic touch-sensing equipment comprises a uniform, a plurality of gloves, a plurality of sensors, and an alarm circuit. The plurality of sensors and the alarm circuit are installed in the uniform. Each individual sensor selected from the plurality of sensors is activated when a glove selected from the plurality of gloves touches the individual sensor. The alarm circuit monitors the plurality of sensors and initiates the audio alarm and the visual alarm when two or more individual sensors have been contacted by one or more gloves selected from the plurality of gloves.

18 Claims, 5 Drawing Sheets

ATHLETIC TOUCH-SENSING EQUIPMENT

CROSS REFERENCES TO RELATED APPLICATIONS

Not Applicable

STATEMENT REGARDING FEDERALLY SPONSORED RESEARCH

Not Applicable

REFERENCE TO APPENDIX

Not Applicable

BACKGROUND OF THE INVENTION

Field of the Invention

The present invention relates to the field of sports including measuring a physical parameter related to a sporting activity, more specifically, a switching system configured to detect contact between competitors.

SUMMARY OF INVENTION

The athletic touch-sensing equipment is configured for use in physical activity. The physical activity is further defined with a first competitor and a second competitor. The physical activity is further defined with a rule set that governs physical contact between the first competitor and the second competitor. The athletic touch-sensing equipment: 1) senses when contact is made between the first competitor and a second competitor; and, 2) detects when a threshold of contact is indicate that contact is detected. The athletic touch-sensing equipment comprises a uniform, a plurality of gloves, a plurality of sensors, and an alarm circuit. The plurality of sensors and the alarm circuit attach to the uniform. Each individual sensor selected from the plurality of sensors is activated when a glove selected from the plurality of gloves touches the individual sensor. The alarm circuit monitors the plurality of sensors and initiates the audio alarm and the visual alarm when two or more individual sensors are contacted by one or more gloves selected from the plurality of gloves.

The assumed model of play is a follows: if the second competitor touches the first competitor across two or more sensors selected from the plurality of sensors then the contact is significant enough to warrant the initiation of the alarm. Significant contact events include, but are not limited two: 1) simultaneously touching a first individual sensor with the left hand and a second individual sensor with the right hand; or, 2) simultaneously touching a first individual sensor and a second individual sensor with a hand selected from the group consisting of the left hand and the right hand.

These together with additional objects, features and advantages of the athletic touch-sensing equipment will be readily apparent to those of ordinary skill in the art upon preferred, but nonetheless illustrative, embodiments when taken in conjunction with the accompanying drawings.

In this respect, before explaining the current embodiments of the athletic touch-sensing equipment in detail, it is to be understood that the athletic touch-sensing equipment is not limited in its applications to the details of construction and arrangements of the components set forth in the following description or illustration. Those skilled in the art will appreciate that the concept of this disclosure may be readily utilized as a basis for the design of other structures, methods, and systems for carrying out the several purposes of the athletic touch-sensing equipment.

It is therefore important that the claims be regarded as including such equivalent construction insofar as they do not depart from the spirit and scope of the athletic touch-sensing equipment. It is also to be understood that the phraseology and terminology employed herein are for purposes of description and should not be regarded as limiting.

BRIEF DESCRIPTION OF DRAWINGS

The accompanying drawings, which are included to provide a further understanding of the invention are incorporated in and constitute a part of this specification, illustrate an embodiment of the invention and together with the description meant to be exemplary illustrations provided to enable persons skilled in the art to practice the disclosure and are not intended to limit the scope of the appended claims.

DETAILED DESCRIPTION OF THE EMBODIMENT

The following detailed description is merely exemplary in nature and is not intended to limit the described embodiments of the application and uses of the described embodiments. As used herein, the word "exemplary" or "illustrative" means "serving as an example, instance, or illustration." Any implementation described herein as "exemplary" or "illustrative" is not necessarily to be construed as preferred or advantageous over other implementations. All of the implementations described below are exemplary implementations provided to enable persons skilled in the art to practice the disclosure and are not there is no intention to be bound by any expressed or implied theory presented in the preceding technical field, background, brief summary or the following detailed description.

Figure 1:
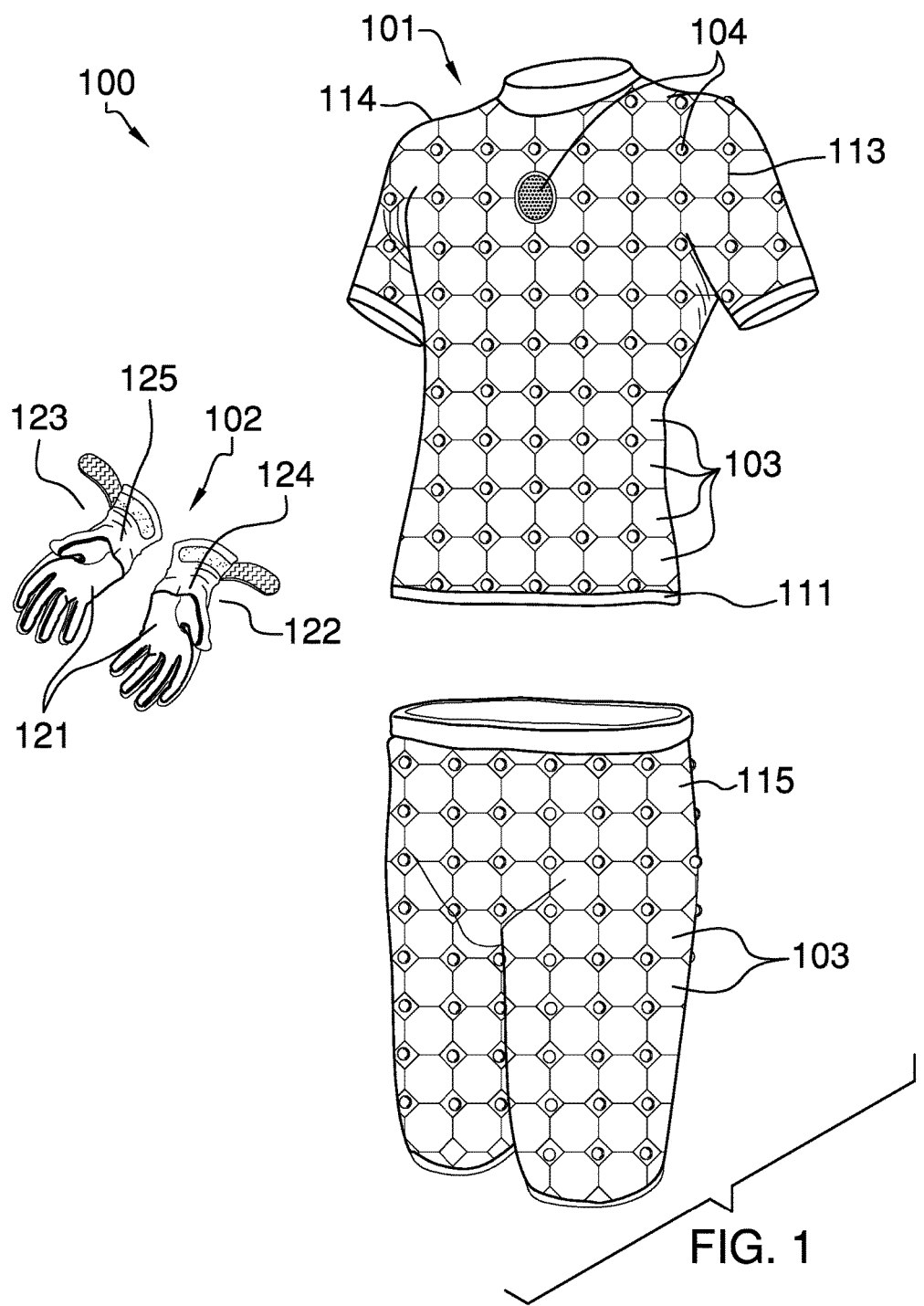
FIG. 1 is a perspective view of an embodiment of the disclosure.
Figure 2:
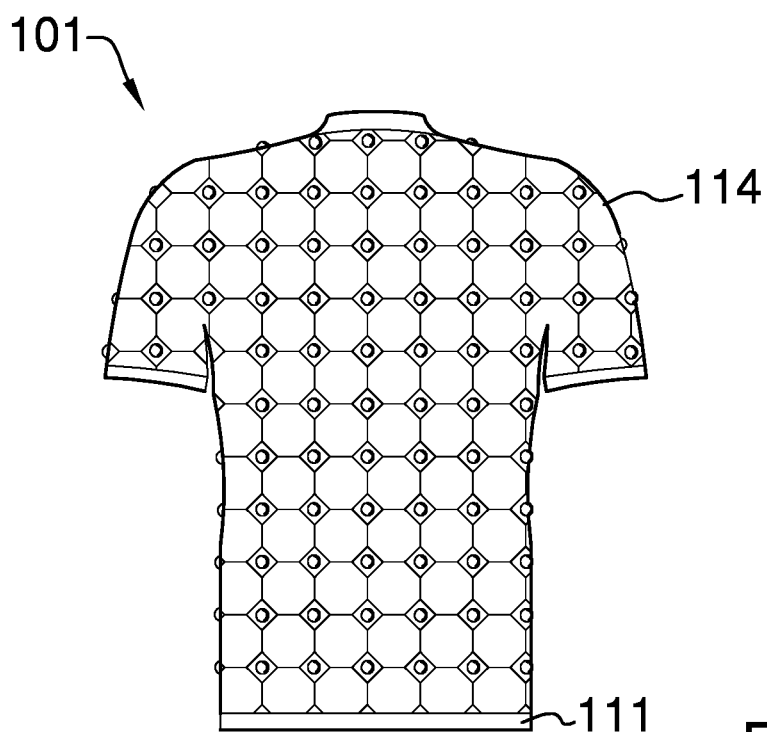
FIG. 2 is a rear view of an embodiment of the disclosure.
Figure 2:
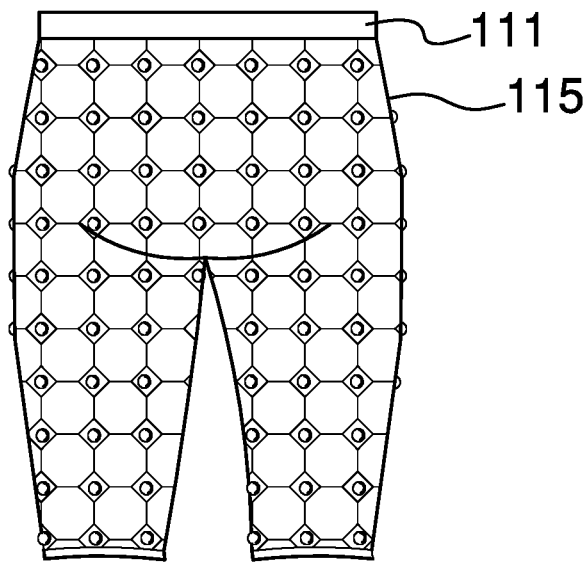
Figure 3:
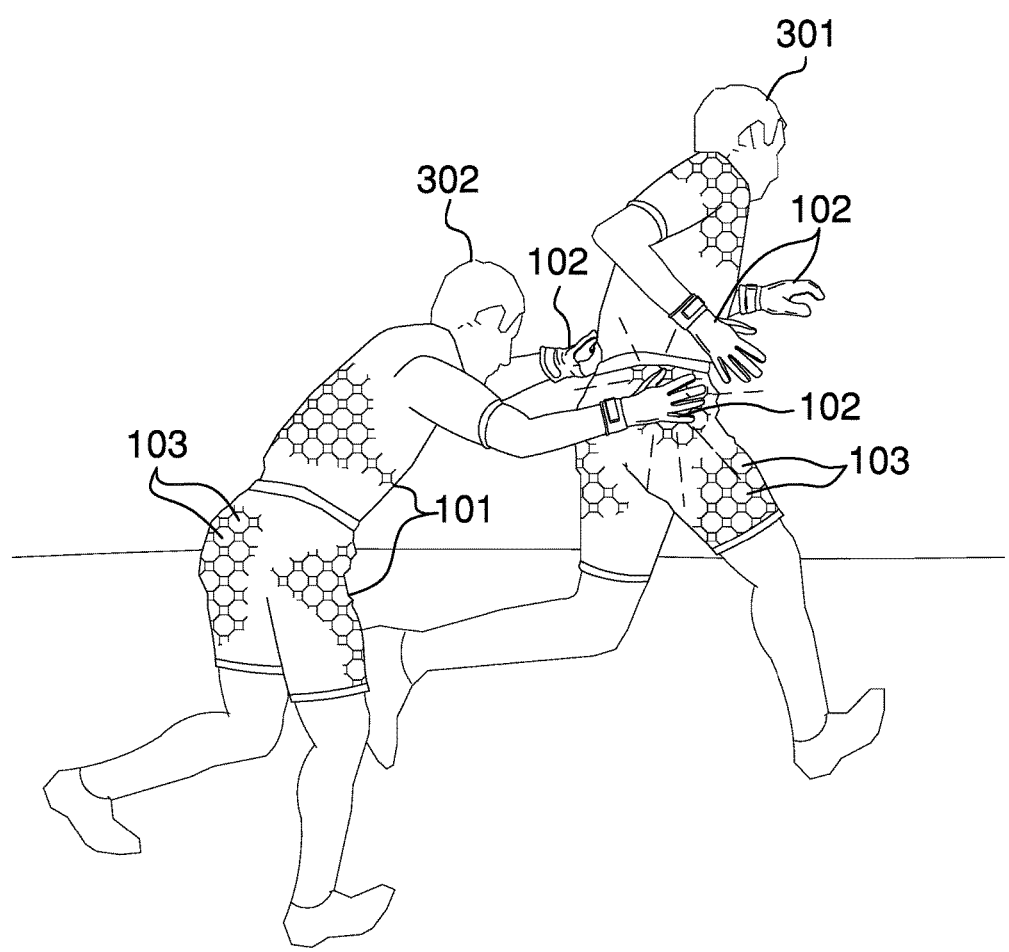
FIG. 3 is an in-use view of an embodiment of the disclosure.
Figure 4:
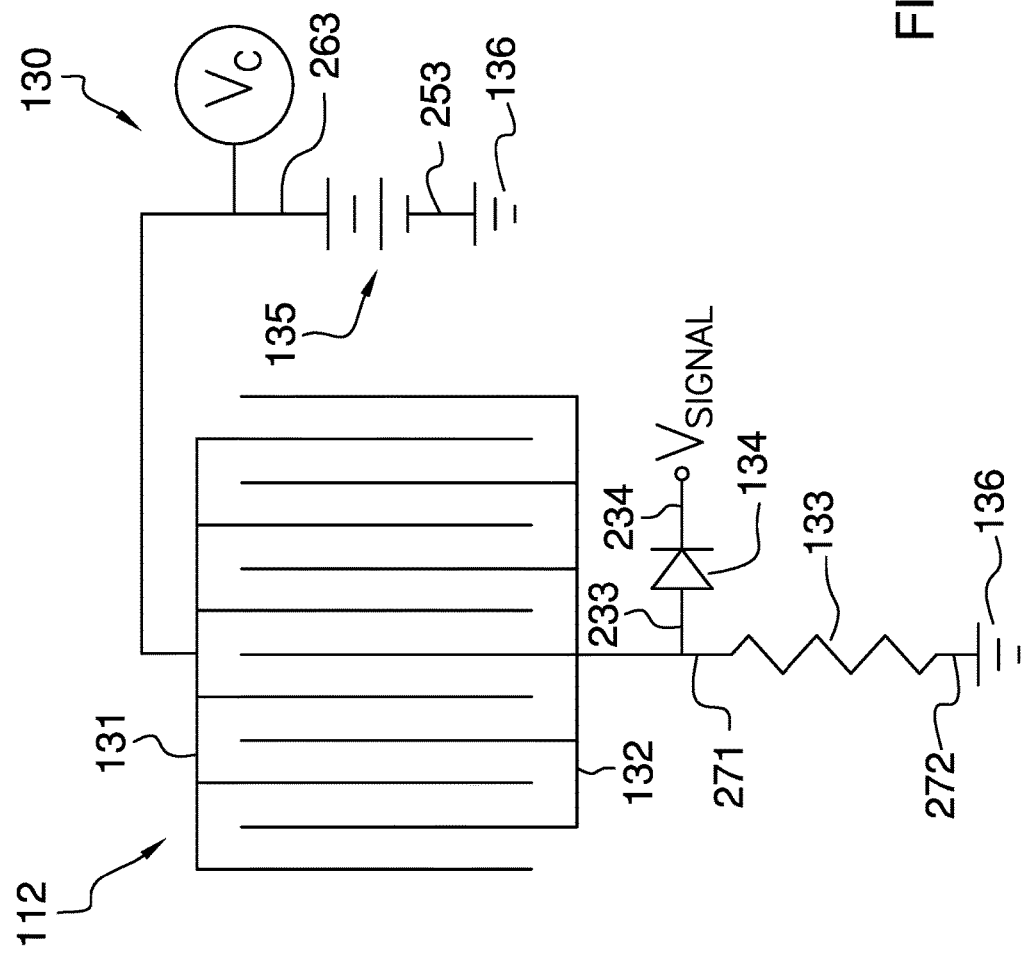
FIG. 4 is a schematic view of an embodiment of the disclosure.
Figure 5:
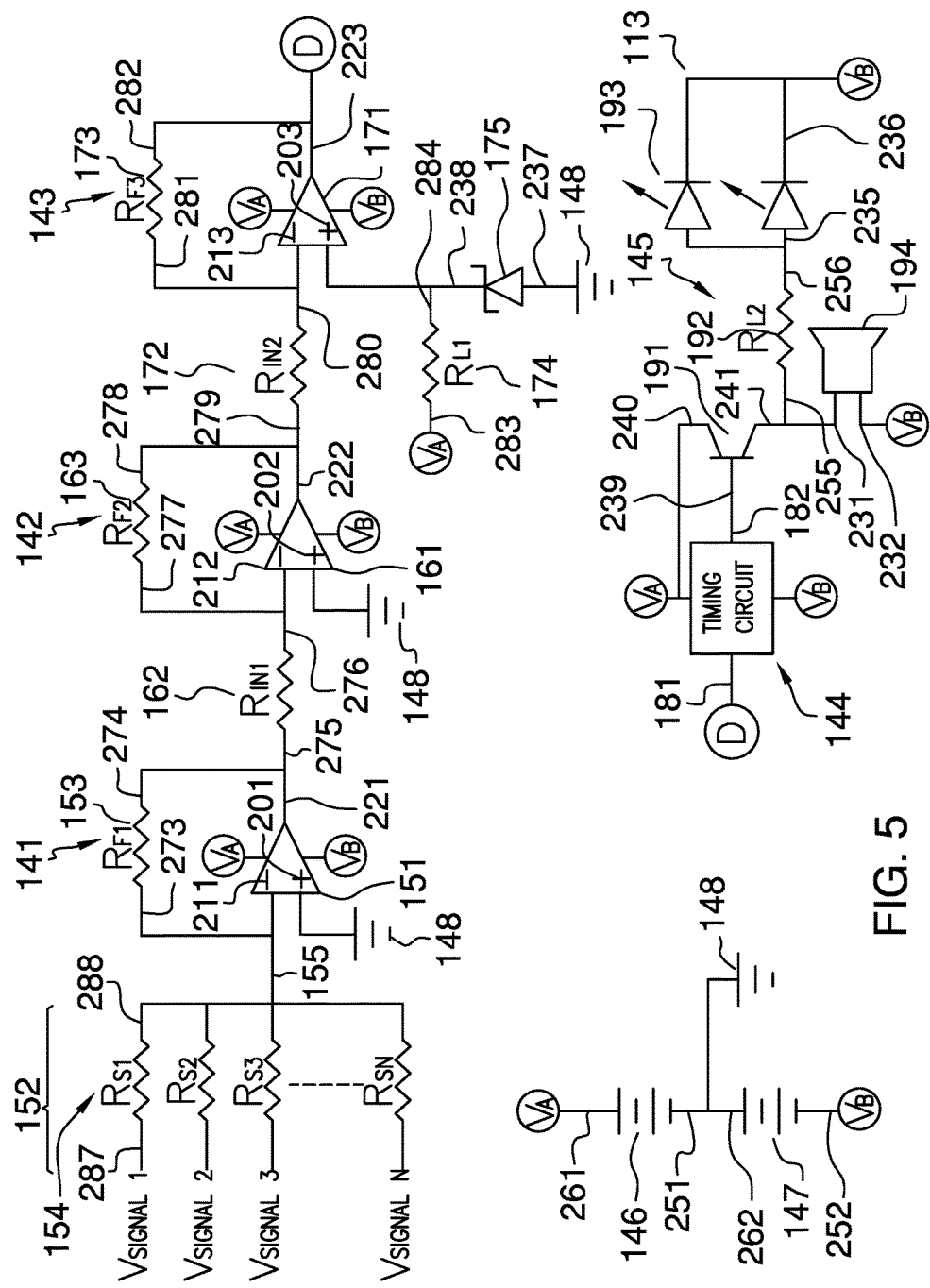
FIG. 5 is a schematic view of an embodiment of the disclosure.

Detailed reference will now be made to one or more potential embodiments of the disclosure, which are illustrated in FIGS. 1 through 5.

The athletic touch-sensing equipment 100 (hereinafter invention) is configured for use in physical activity. The physical activity is further defined with a first competitor 301 and a second competitor 302. The physical activity is further defined with a rule set that governs physical contact between the first competitor 301 and the second competitor 302. The invention 100: 1) senses when contact is made between the first competitor 301 and a second competitor 302; and, 2) detects when a threshold of contact is exceeded and generates an audio alarm and a visual alarm to indicate that contact is detected. The invention 100 comprises a uniform 101, a plurality of gloves 102, a plurality of sensors 103, and an alarm circuit 104. The plurality of sensors 103 and the alarm circuit 104 attach to in the uniform 101. Each individual sensor 130 selected from the plurality of sensors 103 is activated when a glove selected from the plurality of gloves 102 touches the individual sensor 130. The alarm circuit 104 monitors the plurality of sensors 103 and individual sensors 130 are contacted by one or more gloves selected from the plurality of gloves 102.

The assumed model of play is as follows: if the second competitor 302 touches the first competitor 301 across two or more sensors selected from the plurality of sensors 103 then the contact is significant enough to warrant the initiation of the alarm. Significant contact events include, but are not limited two: 1) simultaneously touching a first individual sensor 130 with a left glove 122 and a second individual sensor 130 with the right glove 123; or, 2) simultaneously touching a first individual sensor 130 and a second individual sensor 130 with a glove selected from the group consisting of the left glove 122 and the right glove 123.

The uniform 101 is a garment. The first competitor 301 wears an instantiation of the uniform 101 during the competition. The second competitor 302 wears an instantiation of the uniform 101 during the competition. The instantiation of the uniform 101 worn by the first competitor 301 is visibly different than the instantiation of the uniform 101 worn by the second competitor 302. The uniform 101 worn by the first competitor 301 senses when the uniform 101 has come in contact with the second competitor 302. The uniform 101 worn by the second competitor 302 senses when the uniform 101 has come in detected, the uniform 101 activates the alarm circuit 104 which actuates an audible and visible alarm indicating that contact between the first competitor 301 and the second competitor 302 has occurred. The uniform 101 comprises a textile 111 that further comprises a first conductive network 112 and a second conductive network 113.

The textile 111 is a commercially available elastic textile. The selected textile 111 is suitable for use as a compression garment. The design, manufacture, and use of a compression garment as a uniform 101 from a textile 111 is well-known and documented in the textile arts.

The first conductive network 112 is a pattern printed on the exterior surface of the textile 111. By exterior is meant the surface of the uniform 101 that is intended to form the exterior surfaces of a garment selected from the group consisting of the compression shirt 114 and the compression pants 115. The first conductive network 112 is printed using an electrically conductive ink such that the first conductive network 112 forms a web of conductors across the exterior surface of the textile 111. The first conductive network 112 forms the sensing component of each of the plurality of sensors 103. When a glove selected from the plurality of gloves 102 comes in contact with the first conductive network 112, the conductive network 112 that is registered by the individual sensor 130 located at the point of contact.

The second conductive network 113 is a pattern printed on the interior surface of the textile 111. By interior is meant the surface of the uniform 101 that is intended to form the interior surfaces of a garment selected from the group consisting of the compression shirt 114 and the compression pants 115. The second conductive network 113 is printed using an electrically conductive ink such that the second conductive network 113 forms a conductive network across the interior surface of the textile 111. The second conductive network 113 carries the electrical signals that operate the visual and audible alarms generated by the alarm circuit 104.

The textile 111 that forms the uniform 101 is further processed to comprise a compression shirt 114 and compression pants 115. The compression shirt 114 is a shirt formed from the textile 111. Methods to form a compression shirt 114 from a textile 111 are well-known and documented in the textile and apparel arts. The compression pants 115 is a pair of pants formed from the textile 111. Methods to form compression pants 115 from a textile 111 are well-known and documented in the textile and apparel arts.

The plurality of gloves 102 are a pair of gloves that are instantiation of the plurality of gloves 102 worn by the first competitor 301 is visibly different than the instantiation of the plurality of gloves 102 worn by the second competitor 302. The plurality of gloves 102 is an electrically conductive structure.

The plurality of gloves 102 worn by the second competitor 302 interacts with the uniform 101 worn by the first competitor 301 such that the plurality of gloves 102 of the second competitor 302 will initiate the operation of the alarm circuit 104 of the uniform 101 of the first competitor 301 when the plurality of gloves 102 of the second competitor 302 comes in contact with the uniform 101 of the first competitor 301.

The plurality of gloves 102 worn by the first competitor 301 interacts with the uniform 101 worn by the second competitor 302 such that the plurality of gloves 102 of the first competitor 301 will initiate the operation of the alarm circuit 104 of the uniform 101 of the second competitor 302 when the plurality of gloves 102 of the first competitor 301 comes in contact with the uniform 101 of the second competitor 302.

Each of the plurality of gloves 102 further comprises a conductive glove coating 121. The plurality of gloves 102 comprises a left glove 122 and a right glove 123. The left glove 122 is further defined with a left palm 124. The right glove 123 is further defined with a right palm 125.

The conductive glove coating 121 is a conductive coating printed on each of the plurality of gloves 102. The conductive glove coating 121 forms a conductive surface that completes a circuit between branches of the first conductive network 112 such that a circuit is completed to generate the voltage signal from the individual sensor 130 to the alarm circuit 104.

The left glove 122 is the glove worn on the left hand of the selected competitor. The left palm 124 refers to the palm and finger region of the left glove 122. The conductive glove coating 121 is applied to the left palm 124 of the left glove 122.

The right glove 123 is the glove worn on the right hand of the selected competitor. The right palm 125 refers to the palm and finger region of the right glove 123. The conductive glove coating 121 is applied to the right palm 125 of the right glove 123.

The plurality of sensors 103 detect contact between a glove selected from the plurality of gloves 102 and the uniform 101. Each of the plurality of sensors 103 are identical. The plurality of sensors 103 are formed using the first conductive network 112 printed on the exterior surface of the textile 111. The plurality of sensors 103 comprises a collection of individual sensors 130.

Each individual sensor 130 is an electrical circuit formed on the exterior surface of the textile 111. Each individual sensor 130 comprises a positive conducting web 131, a negative conducting web 132, a pull-down resistor 133, a signal diode 134, a third battery 135, and a second electric ground 136. The pull-down resistor 133 is further defined with a first lead 271 and a second lead 272. The signal diode 134 is further defined with a signal anode 233 and a signal cathode 234. The third battery 135 is further defined with a third battery anode 253 and a third battery cathode 263.

The positive conducting web 131 refers to a web of exposed electrically conductive lines printed on the textile 111. The positive conducting web 131 maintains a single voltage potential across all points of the positive conducting web 131. The negative conducting web 132 refers to a web of exposed electrically conductive lines printed on the textile 111. The negative conducting web 132 maintains a single voltage potential across all points of the negative conducting web 132. The positive conducting web 131 and the negative conducting web 132 are printed on the textile 111 in an interlaced pattern.

The pull-down resistor 133 is a resistor placed in series between the negative conducting web 132 and the second electric ground 136. The voltage signal generated by the individual sensor 130 is presented across the pull-down resistor 133. The signal diode 134 is a diode that electrically isolates the individual sensor 130 from the alarm circuit 104. The signal diode 134 prevents the backflow of electricity from the alarm circuit 104 into the individual sensor 130. The signal diode 134 is placed in series between the pull-down resistor 133 and the alarm circuit 104.

The third battery 135 is a chemical device. The third battery 135 provides the electrical energy necessary to: 1) create a voltage differential between the positive conducting web 131 and the negative conducting web 132; and, 2) to generate the voltage signal that is presented across the signal diode 134. The second electric ground 136 is a voltage reference that is used throughout the circuit forming the individual sensor 130.

When a glove selected from the group consisting of the left glove 122 and the right glove 123 comes in contact with the individual sensor 130, the conductive glove coating 121 completes a circuit between the positive conducting web 131 and the negative conducting web 132 that allows the third battery 135 to energize the pull-down resistor 133.

The alarm circuit 104 is an electrical circuit. The alarm circuit 104 receives as inputs a voltage signal from each individual sensor 130 contained within the plurality of sensors 103. Specifically, when a glove selected from the plurality of gloves 102 contacts an individual sensor 130 selected from the plurality of sensors 103, the selected individual sensor 130 generates a positive voltage signal that is detected by the alarm circuit 104. When the alarm circuit 104 detects a positive voltage signal from both a first individual sensor 130 and a second individual sensor 130, the alarm circuit 104 initiates a visible and an audible alarm that indicates that two separated points of contact have occurred between the first competitor 301 and the second competitor 302.

The alarm circuit 104 comprises a summing circuit 141, an inverting circuit 142, a comparator circuit 143, a timing circuit 144, an announcement circuit 145, a first battery 146, a second battery 147, and a first electric ground 148. The first battery 146 is further defined with a first battery anode 251 and a first battery cathode 261. The second battery 147 is further defined with a second battery anode 252 and a second battery cathode 262.

The summing circuit 141 is an electrical circuit that sums the voltages presented across all the voltages signals presented by the plurality of sensors 103. Specifically, the output presented by the summing circuit 141 at the first output 221 of the summing circuit 141 is the greater of: 1) the sum of all the voltage signals presented across the plurality of sensors 103 multiplied by negative one; or, 2) the negative saturation output voltage of a first amplifier 151 contained within the summing circuit 141. If the voltage output of the summing circuit 141 is less than or equal to negative two times the nominal voltage of the third battery 135, then the assumption is made that two individual sensors 130 have simultaneously detected contact with a glove selected from the plurality of gloves 102. The design and use of a summing circuit 141 is well-known and documented in the electrical arts.

The summing circuit 141 comprises a first amplifier 151, a signal resistor network 152, a first feedback resistor 153, a plurality of signal resistors 154, and a signal node 155. The first amplifier 151 is further defined with a first positive input 201, a first negative input 211, and a first output 221. The first feedback resistor 153 is further defined with a third lead 273 and a fourth lead 274. Each of the plurality of signal resistors 154 is further defined with a signal lead 287 and a common lead 288.

The first amplifier 151 is a commercially available differential amplifier. In the first potential embodiment of the disclosure, the applicant prefers that the first amplifier 151 be an operational amplifier. The first feedback resistor 153 is a resistor that controls the gain of the first amplifier 151.

The signal resistor network 152 is a resistive network that feeds the plurality of voltage signals received from the plurality of sensors 103 into the first amplifier 151. The signal resistor network 152 comprises the plurality of signal resistors 154 and the signal node 155. Each of the plurality of signal resistors 154 is a resistor. Each of the plurality of signal resistors 154 electrically connects in series between the signal diode 134 of each individual sensor 130 selected from the plurality of sensors 103 and the signal node 155. Each of the plurality of signal resistors 154 has an identical resistance value. The resistance of each of the plurality of signal resistors 154 equals the value of the first feedback resistor 153. The signal node 155 is a common point with a common electrical potential that electrically connects the plurality of signal resistors 154 with the first amplifier 151 and the first feedback resistor 153.

The inverting circuit 142 is an electrical circuit that is used to invert the output of the summing circuit 141. Specifically, the output presented by the inverting circuit 142 at the second output 222 of the inverting circuit 142 equals the first output 221 presented by the summing circuit 141 multiplied by negative one. The inverting circuit 142 inverts the output voltage presented by the summing circuit 141 to allow a comparison of the presented voltage to a reference voltage. The use of an inverting circuit 142 is well-known and documented in the electrical arts.

The inverting circuit 142 comprises a second amplifier 161, a first input resistor 162, and a second feedback resistor 163. The second amplifier 161 is further defined with a second positive input 202, a second negative input 212, and a second output 222. The first input resistor 162 is further defined with a fifth lead 275 and a sixth lead 276. The second feedback resistor 163 is further defined with a seventh lead 277 and an eighth lead 278.

The second amplifier 161 is a commercially available differential amplifier. In the first potential embodiment of the disclosure, the applicant prefers that the second amplifier 161 be an operational amplifier. The first input resistor 162 is a resistor placed in series between the first output 221 of the first amplifier 151 and the second amplifier 161. The second feedback resistor 163 is a resistor that controls the gain of the second amplifier 161.

The comparator circuit 143 compares the output voltage presented by the inverting circuit 142 to an internally generated reference voltage. The reference voltage used by the comparator circuit 143 is nominally equal to twice the level of any single voltage signal presented by each of the individual sensors 130. When the voltage presented by the inverting circuit 142 is greater than the reference voltage, the comparator circuit 143 presents a negative voltage at a third output 223 of the comparator circuit 143. The negative voltage of the comparator circuit 143 is used to trigger the operation of the timing circuit 144. The design and use of a comparator circuit 143 is well-known and documented in the electrical arts.

The comparator circuit 143 comprises a third amplifier 171, a second input resistor 172, a third feedback resistor 173, a first limit resistor 174, and a Zener diode 175. The third amplifier 171 is further defined with a third positive input 203, a third negative input 213, and a third output 223. The second input resistor 172 is further defined with a ninth lead 279 and a tenth lead 280. The third feedback resistor 173 is further defined with an eleventh lead 281 and a twelfth lead 282. The first limit resistor 174 is further defined with a thirteenth lead 283 and a fourteenth lead 284. The Zener diode 175 is further defined with a Zener anode 237 and a Zener cathode 238.

The third amplifier 171 is a commercially available differential amplifier. In the first potential embodiment of the disclosure, the applicant prefers that the third amplifier 171 be an operational amplifier. The second input resistor 172 is a resistor placed in series between the second output 222 of the second amplifier 161 and the third amplifier 171. The third feedback resistor 173 is a resistor that controls the gain of the third amplifier 171.

The first limit resistor 174 is a resistor placed in series between the first battery 146 and the Zener diode 175 to limit the flow of electricity through the Zener diode 175. The Zener diode 175 is a well-known and documented electrical device that creates a reference voltage within an electrical circuit. The Zener voltage of the Zener diode 175 is selected to determine the sensitivity of the invention 100 to contact between the first competitor 301 and the second competitor 302. In the first potential embodiment of the disclosure, the Zener voltage of the Zener diode 175 is selected to be between 180% and 200% of the value of the voltage presented by any individual sensor 130.

The timing circuit 144 comprises an input lead 181 and an output lead 182. The timing circuit 144 is an electrical circuit. The timing circuit 144 receives as an input the negative voltage pulse from the third output 223 of the comparator circuit 143 at the input lead 181. Upon receiving the negative pulse, the timing circuit 144 generates an output voltage at the output lead 182. The output voltage at the output lead 182 initiates the actuation of the announcement circuit 145 which actuates an audible and visible alarm indicating that contact between the first competitor 301 and the second competitor 302. In the first potential embodiment of the disclosure, the timing circuit 144 is based on one or more commercially available "555" integrated timing circuits (including associated components such as capacitors and resistors). The design and use of a timing circuit 144 is well-known and documented in the electrical arts.

The announcement circuit 145 is an electrical circuit that generates the visual alarm and the audible alarm when actuated by the timing circuit 144. The announcement circuit 145 comprises a transistor 191, a second limit resistor 192, a plurality of LEDs 193, and a speaker 194. The transistor 191 is further defined with a base 239 and a collector 240. The second limit resistor 192 is further defined with a fifteenth lead 285 and a sixteenth lead 286. Each of the plurality of LEDs 193 is further defined with a LED anode 235 and a LED cathode 236. The speaker 194 is further defined with a first speaker lead 231 and a second speaker lead 232.

The transistor 191 is a well-known and documented electrical device that acts as a switch. The operation of the transistor 191 is controlled by the voltage presented at the output lead 182 of the timing circuit 144. The transistor 191 is operated as a switch that controls the flow of electricity from the first battery 146 into the plurality of LEDs 193 and the speaker 194.

The second limit resistor 192 is a resistor placed in series between the transistor 191 and the plurality of LEDs 193 to limit the flow of electricity through the plurality of LEDs 193. Each of the plurality of LEDs 193 is visibly attached to the uniform 101. Each of the plurality of LEDs 193 illuminates when contact is detected by the alarm circuit 104.

The speaker 194 is a buzzer. The speaker 194 generates an audible sound when contact is detected by the alarm circuit 104.

The first battery 146 is a chemical device. The first battery 146 provides a portion of the electrical energy necessary to operate the alarm circuit 104. To operate properly, the nominal voltage of the first battery 146 must be greater than two times the nominal voltage of the third battery 135. The second battery 147 is a chemical device. The second battery 147 provides a portion of the electrical energy necessary to operate the alarm circuit 104. To operate properly, the nominal voltage of the second battery 147 must be greater than two times the nominal voltage of the third battery 135. The first electric ground 148 is a voltage reference that is used throughout the circuits forming the alarm circuit 104. In the first potential embodiment of the disclosure, the first electric ground 148 electrically connects to the second electric ground 136 of each of the individual sensor 130 contained within the plurality of sensors 103.

The following eight paragraphs describe the assembly of the invention 100.

The first conductive network 112 is printed on the exterior surface of the textile 111 using a conductive ink applied with well-known and documented textile printing equipment. The second conductive network 113 is formed on the interior surface of the textile 111 using a conductive ink applied with well-known and documented textile printing equipment.

The third battery cathode 263 of the third battery 135 electrically connects to the positive conducting web 131. The third battery anode 253 of the third battery 135 electrically connects to the second electric ground 136. The negative conducting web 132 electrically connects to the first lead 271 of the pull-down resistor 133. The negative conducting web 132 electrically connects to the signal anode 233 of the signal diode 134. The second lead 272 of the pull-down resistor 133 electrically connects to the second electric ground 136. The signal cathode 234 of the signal diode 134 of each of the individual sensor 130 electrically connects to the signal lead 287 of the resistor selected from the plurality of signal resistors 154 associated with the individual sensor 130.

The common lead 288 of each of the plurality of signal resistors 154 electrically connects to a single point called the signal node 155. The signal node 155 electrically connects to the first negative input 211 of the first amplifier 151. The signal node 155 electrically connects to the third lead 273 of the first feedback resistor 153.

The first positive input 201 of the first amplifier 151 electrically connects to the first electric ground 148. The first output 221 of the first amplifier 151 electrically connects to the fourth lead 274 of the first feedback resistor 153. The first output 221 of the first amplifier 151 electrically connects to the fifth lead 275 of the first input resistor 162. The sixth lead 276 of the first input resistor 162 electrically connects to the second negative input 212 of the second amplifier 161. The sixth lead 276 of the first input resistor 162 electrically connects to the seventh lead 277 of the second feedback resistor 163. The second positive input 202 of the second amplifier 161 electrically connects to the first electric ground 148. The second output 222 of the second amplifier 161 electrically connects to the eighth lead 278 of the second feedback resistor 163.

The second output 222 of the second amplifier 161 electrically connects to the ninth lead 279 of the second input resistor 172. The tenth lead 280 of the second input resistor 172 electrically connects to the third negative input 213 of the third amplifier 171. The tenth lead 280 of the second input resistor 172 electrically connects to the eleventh lead 281 of the third feedback resistor 173. The third positive input 203 of the third amplifier 171 electrically connects to the fourteenth lead 284 of the first limit resistor 174. The first battery anode 251 electrically connects to the thirteenth lead 283 of the first limit resistor 174. The third positive input 203 of the third amplifier 171 electrically connects to the Zener cathode 238 of the Zener diode 175. The Zener anode 237 of the Zener diode 175 electrically connects to the first electric ground 148. The third output 223 of the third amplifier 171 electrically connects to the twelfth lead 282 of the third feedback resistor 173.

The third output 223 of the third positive input 203 electrically connects to the input lead 181 of the timing circuit 144. The output lead 182 of the timing circuit 144 electrically connects to the base 239 of the transistor 191. The collector 240 of the transistor 191 electrically connects to the first battery cathode 261 of the first battery 146. The emitter 241 of the transistor 191 electrically connects to the fifteenth lead 285 of the second limit resistor 192. The emitter 241 of the transistor 191 electrically connects to the first speaker lead 231 of the speaker 194. The second speaker lead 232 of the speaker 194 electrically connects to the second battery anode 252 of the second battery 147.

The sixteenth lead 286 of the second limit resistor 192 electrically connects to the LED anode 235 of each of the plurality of LEDs 193. The LED cathode 236 of each of the plurality of LEDs 193 electrically connects to the second battery anode 252 of the second battery 147.

The first battery cathode 261 of the first battery 146 electrically connects to the positive power terminals of the first amplifier 151, the second amplifier 161, the third amplifier 171, the timing circuit 144, and to the collector 240 of the transistor 191. The second battery anode 252 of the second battery 147 electrically connects to the negative power terminals of the first amplifier 151, the second amplifier 161, the third amplifier 171, and the timing circuit 144. The second battery anode 252 of the second battery 147 electrically connects to the second speaker lead 232 of the speaker 194. The second battery anode 252 of the second battery 147 electrically connects to the LED cathode 236 of each of the plurality of LEDs 193.

The first battery anode 251 of the first battery 146 electrically connects to the first electric ground 148. The second battery cathode 262 of the second battery 147 electrically connects to the first electric ground 148. The first electric ground 148 electrically connects to the second electric ground 136.

The following definitions were used in this disclosure:

Amplifier: As used in this disclosure, an amplifier refers to an electronic component that increases voltage, current, or power of an input signal. Specifically, within this disclosure, an amplifier refers to a differential amplifier. A differential amplifier is a device two input electrical device with a single output. A difference amplifier amplifies the voltage difference between the two inputs.

Anodes and Cathodes: As used in this disclosure, an anode and a cathode are the connecting terminals of an electrical circuit element or device. Technically, the cathode is the terminal through which the physical electrons flow into the device. The anode is the terminal through which the physical electrons flow out of the device. As a practical matter, the anode refers to: 1) the positive terminal of a power consuming electrical circuit element; 2) the negative terminal of a discharging battery or an electrical power source; and, 3) the positive terminal of a charging battery. As a further practical matter the cathode refers to: 1) the negative terminal of a power consuming electrical circuit element; 2) the positive terminal of a discharging battery or an electrical power source; and, 3) the negative terminal of a charging battery.

Battery: As used in this disclosure, a battery is a chemical device consisting of one or more cells, in which chemical energy is converted into electricity and used as a source of power.

Buzzer: As used in this disclosure, a buzzer is two lead electrical device that generates an audible sound when a voltage is applied to the two leads.

Competitor: As used in this disclosure, a competitor is a person who is participating in a competitive activity such as a sporting event or a game.

Conductor: As used in this disclosure, a conductor is a material or structure that allows electrons to flow in response to an applied voltage.

Diode: As used in this disclosure, a diode is a two terminal semiconductor device that allows current flow in only one direction. The two terminals are called the anode and the cathode. Electric current is allowed to pass from the anode to the cathode.

Elastic: As used in this disclosure, an elastic is a material or object that deforms when a force is applied to it and that is able to return to its relaxed shape after the force is removed. A material that exhibits these qualities is also referred to as an elastomeric material.

Elastic Textile: As used in this disclosure, an elastic textile is a textile that contains elastic yarns as some of the yarns that make up the textile. An elastic textile is constructed such that the elastic textile will stretch when a force is applied and will return to its original shape when after the force is removed.

Electrical Ground: As used in this disclosure, an electrical ground is a common reference voltage used in the design and implementation of electrical circuits. An electrical ground is often, but not necessarily, the discharge point of electric currents flowing through an electric circuit.

Exterior: As used in this disclosure, the exterior is used as a relational term that implies that an object is not contained within the boundary of a structure or a space.

Feedback: As used in this disclosure, feedback refers to a system, including engineered systems, or a subsystem further comprising an "input" and an "output" wherein the difference between the output of the engineered system or subsystem and a reference is used as, or fed back into, a portion of the input of the system or subsystem. Examples of feedback in engineered systems include, but are not limited to, a fluid level control device such as those typically used in a toilet tank, a cruise control in an automobile, a fly ball governor, a thermostat, and almost any electronic device that comprises an amplifier. Feedback systems in nature include, but are not limited to, thermal regulation in animals and blood clotting in animals (wherein the platelets involved in blood clotting release chemical to attract other platelets).

Glove: As used in this disclosure, a glove is an item of apparel that covers a hand. The glove comprises five finger stalls into which the fingers of the hand are inserted. A glove is further defined with a palm side and a back side. The palm side is proximal to the palm of the hand. The back side is distal from the palm side.

Interior: As used in this disclosure, the interior is used as a relational term that implies that an object is contained within the boundary of a structure or a space.

Interlace: As used in this disclosure, to interlace means to align a series of linear objects selected in an alternating manner. The linear objects are selected from two or more groups of linear objects. The alternating manner is a function of the group the linear object is identified with.

Lead: As used in this disclosure, a lead is a conductor that is physically used to electrically connect an electrical component into a larger circuit assembly.

LED: As used in this disclosure, an LED is an acronym for a light emitting diode. A light emitting diode is a diode that is also a light source.

Limit Resistor: As used in this disclosure, a limit resistor is an electrical resistor that is used to limit the flow of electric current through an electrical circuit.

Mirror Image: As used in this disclosure, a mirror image refers to a second object that is a reproduction of a first object wherein the second object is identical to the first object except that the orientation of the second object is reversed relative to the first object as if the second object has been reflected by a plane of a mirror (often called the mirror plane or plane of reflection).

Nominal: As used in this disclosure, the term nominal refers to a designed or intended value of the measure of a physical parameter of an object. The use of the term nominal implies that the exact value of the physical parameter of an instantiation of the object can have insignificant variation from the nominal value. By insignificant is meant that these variations will not interfere with the intended use of the object. The sources of variations can include, but are not limited to, manufacturing tolerances and traditional rounding practices such as those employed in the sale of electrical circuit components.

Palm: As used in this disclosure, the palm of the hand is identified as the portions of a left hand and a right hand that contact each other when the left-hand presses against the right hand when the left hand and right hand are in alignment. The palm of the left hand is the mirror image of the palm of the right hand.

Pants: As used in this disclosure, pants refers to a garment that: 1) covers a portion of a person from the waist to the ankles; 2) comprises two individual sleeves; 3) wherein each individual sleeve covers a body part selected from the group consisting of the left leg of the person and the right leg of the person. Pants are commonly referred to as a pair of pants. Each individual sleeve is commonly referred to as a pant leg.

Pull-Down Resistor: As used in this disclosure, a pull-down resistor is an electrical resistor that is used within a switching or logic to present a predetermined signal voltage to an externally provided logic circuit.

Relaxed Shape: As used in this disclosure, a structure is considered to be in its relaxed state when no shear, strain, or torsional forces are being applied to the structure.

Resistor: As used in this disclosure, a resistor is a well-known and commonly available electrical device that inhibits the flow of electricity through an electric circuit. Within an electric circuit processing alternating currents, the resistor will not affect the phase of the alternating current. A current flowing through a resistor will create a voltage across the terminals of the resistor.

Shirt: As used in this disclosure, a shirt is an item of apparel worn on or over the shoulders of a wearer such that a force applied to the item of apparel in a direction of the foot of the wearer will not disrobe the wearer of the item of apparel.

Sleeve: As used in this disclosure, a sleeve is a tube-like covering placed over a rod, shaft or other cylindrical object.

Textile: As used in this disclosure, a textile is a material that is woven, knitted, braided or felted. Synonyms in common usage for this definition include fabric and cloth.

Timing Circuit: As used in this disclosure, a timing circuit refers to an electrical network of interconnected electrical elements, potentially including but not limited to, resistors, capacitors, diodes, transistors, and integrated circuit devices. The purpose of the timing circuit is to generate an electrical control signal after a predetermined amount of time. In common usage, a timing circuit is also referred to as timing circuitry.

Transistor: As used in this disclosure, a transistor is a general term for a three-terminal semiconducting electrical used for electrical signal amplification and electrical switching applications. There are several designs of transistors. A common example of a transistor is an NPN transistor that further comprises a collector terminal, an emitter terminal, and a base terminal and which consists of a combination of two rectifying junctions (a diode is an example of a rectifying junction). Current flowing from the collector terminal through the emitter terminal crosses the two rectifier junctions. The amount of the electric current crossing the two rectified junctions is controlled by the amount of electric current that flows through the base terminal.

Uniform: As used in this disclosure, a uniform refers to a set of one or more garments that are used to visually organize a group of people into one or more subgroups.

Zener Diode: As used in this disclosure, a Zener diode is a two-terminal electrical device that is used to generate a known voltage that is relatively independent variations in the voltage applied to the Zener diode. The known voltage is referred to as the Zener voltage.

With respect to the above description, it is to be realized that the optimum dimensional relationship for the various components of the invention described above and in FIGS. 1 through 5 include variations in size, materials, shape, form, function, and manner of operation, assembly and use, are deemed readily apparent and obvious to one skilled in the art, and all equivalent relationships to those illustrated in the drawings and described in the specification are intended to be encompassed by the invention.

It shall be noted that those skilled in the art will readily recognize numerous adaptations and modifications which can be made to the various embodiments of the present invention which will result in an improved invention, yet all of which will fall within the spirit and scope of the present invention as defined in the following claims. Accordingly, the invention is to be limited only by the scope of the following claims and their equivalents.

The inventor claims:

1. A contact detection apparatus comprising:
a uniform, a plurality of gloves, a plurality of sensors, and an alarm circuit;
wherein the plurality of sensors and the alarm circuit attach to in the uniform;

wherein each individual sensor selected from the plurality of sensors is activated when a glove selected from the plurality of gloves touches the individual sensor;
wherein the contact detection apparatus is configured for use in physical activity;
wherein the physical activity is further defined with a first competitor and a second competitor;
wherein the physical activity is further defined with a rule set that governs physical contact between the first competitor and the second competitor;
wherein the contact detection apparatus senses when contact is made between the first competitor and a second competitor;
wherein the contact detection apparatus detects when a threshold of contact is exceeded;
wherein the contact detection apparatus generates an audio alarm and a visual alarm;
wherein the alarm circuit monitors the plurality of sensors;
wherein the uniform is a garment;
wherein the first competitor wears an instantiation of the uniform during the competition;
wherein the second competitor wears an instantiation of the uniform during the competition;
wherein the instantiation of the uniform worn by the first competitor is visibly different than the instantiation of the uniform worn by the second competitor;
wherein the uniform worn by the first competitor senses when the uniform has come in contact with the second competitor;
wherein the uniform worn by the second competitor senses when the uniform has come in contact with the first competitor;
wherein the alarm circuit initiates the audio alarm and the visual alarm when two or more individual sensors selected from the plurality of sensors are contacted by one or more gloves selected from the plurality of gloves;
wherein the uniform comprises a textile;
wherein the textile further comprises a first conductive network and a second conductive network;
wherein the textile is an elastic textile;
wherein the first conductive network is a pattern printed on the exterior surface of the textile;
wherein the first conductive network is printed using an electrically conductive ink such that the first conductive network forms a web of conductors across the exterior surface of the textile;
wherein the first conductive network forms the sensing component of each of the plurality of sensors;
wherein the selected glove creates a short circuit across the first conductive network that is registered by the individual sensor located at the point of contact;
wherein the second conductive network is a pattern printed on the interior surface of the textile;
wherein the second conductive network is printed using an electrically conductive ink such that the second conductive network forms a conductive network across the interior surface of the textile;
wherein the second conductive network carries the electrical signals that operate the visual and audible alarms generated by the alarm circuit.

2. The contact detection apparatus according to claim 1 wherein the textile that forms the uniform is further processed to comprise a compression shirt and compression pants;
wherein the compression shirt is a shirt formed from the textile;
wherein the compression pants are a pair of pants formed from the textile.

3. The contact detection apparatus according to claim 2 wherein the plurality of gloves are a pair of gloves;
wherein the plurality of gloves are a part of each instantiation of the uniform;
wherein the instantiation of the plurality of gloves worn by the first competitor is visibly different than the instantiation of the plurality of gloves worn by the second competitor;
wherein the plurality of gloves are electrically conductive structures;
wherein the plurality of gloves worn by the second competitor interacts with the uniform worn by the first competitor such that the plurality of gloves of the second competitor will initiate the operation of the alarm circuit of the uniform of the first competitor when the plurality of gloves of the second competitor comes in contact with the uniform of the first competitor;
wherein the plurality of gloves worn by the first competitor interacts with the uniform worn by the second competitor such that the plurality of gloves of the first competitor will initiate the operation of the alarm circuit of the uniform of the second competitor when the plurality of gloves of the first competitor comes in contact with the uniform of the second competitor.

4. The contact detection apparatus according to claim 3 wherein each of the plurality of gloves further comprises a conductive glove coating;
wherein the conductive glove coating is a conductive coating printed on each of the plurality of gloves;
wherein the conductive glove coating forms a conductive surface that completes a circuit between branches of the first conductive network such that a circuit is completed to generate the voltage signal from the individual sensor to the alarm circuit.

5. The contact detection apparatus according to claim 4 wherein the plurality of gloves comprises a left glove and a right glove;
wherein the left glove is further defined with a left palm;
wherein the right glove is further defined with a right palm;
wherein the conductive glove coating is applied to the left palm of the left glove;
wherein the conductive glove coating is applied to the right palm of the right glove.

6. The contact detection apparatus according to claim 5 wherein each of the plurality of sensors are identical;
wherein each individual sensor is an electrical circuit;
wherein each individual sensor comprises a positive conducting web, a negative conducting web, a pull-down resistor, a signal diode, a third battery, and a second electric ground;
wherein the positive conducting web, the negative conducting web, the pull-down resistor, the signal diode, the third battery, and the second electric ground are electrically interconnected;
wherein the pull-down resistor is further defined with a first lead and a second lead;
wherein the signal diode is further defined with a signal anode and a signal cathode;
wherein the third battery is further defined with a third battery anode and a third battery cathode.

7. The contact detection apparatus according to claim 6
wherein the positive conducting web comprises a web of exposed electrically conductive lines printed on the textile;
wherein the positive conducting web maintains a single voltage potential across all points of the positive conducting web;
wherein the negative conducting web comprises a web of exposed electrically conductive lines printed on the textile;
wherein the negative conducting web maintains a single voltage potential across all points of the negative conducting web;
wherein the positive conducting web and the negative conducting web are printed on the textile in an interlaced pattern.

8. The contact detection apparatus according to claim 7 wherein when a glove selected from the group consisting of the left glove and the right glove comes in contact with the individual sensor, the conductive glove coating completes a circuit between the positive conducting web and the negative conducting web that allows the third battery to energize the pull-down resistor.

9. The contact detection apparatus according to claim 8
wherein the pull-down resistor is a resistor placed in series between the negative conducting web and the second electric ground;
wherein a voltage signal generated by the individual sensor is presented across the pull-down resistor;
wherein the signal diode electrically isolates the individual sensor from the alarm circuit.

10. The contact detection apparatus according to claim 9
wherein the alarm circuit is an electrical circuit;
wherein the alarm circuit receives as inputs a voltage signal from each individual sensor contained within the plurality of sensors;
wherein when a glove selected from the plurality of gloves contacts an individual sensor selected from the plurality of sensors, the selected individual sensor generates the positive voltage signal that is detected by the alarm circuit;
wherein when the alarm circuit detects a positive voltage signal from both a first individual sensor and a second individual sensor, the alarm circuit initiates a visible and an audible alarm;
wherein the alarm circuit comprises a summing circuit, an inverting circuit, a comparator circuit, a timing circuit, an announcement circuit, a first battery, a second battery, and a first electric ground;
wherein the summing circuit, the inverting circuit, the comparator circuit, the timing circuit, the announcement circuit, the first battery, the second battery, and the first electric ground are electrically interconnected;
wherein the first battery is further defined with a first battery anode and a first battery cathode;
wherein the second battery is further defined with a second battery anode and a second battery cathode.

11. The contact detection apparatus according to claim 10
wherein the summing circuit is an electrical circuit that sums the voltages presented across all the voltages signals presented by the plurality of sensors;
wherein the output presented by the summing circuit at the first output of the summing circuit is the greater of: the voltage selected from the group consisting of: A) the sum of all the voltage signals presented across the plurality of sensors multiplied by negative one; and, B) the negative saturation output voltage of a first amplifier contained within the summing circuit;
wherein the inverting circuit is an electrical circuit that is used to invert the output of the summing circuit;
wherein the output presented by the inverting circuit at the second output of the inverting circuit equals the first output presented by the summing circuit multiplied by negative one;
wherein the comparator circuit compares the output voltage presented by the inverting circuit to an internally generated reference voltage;
wherein the reference voltage used by the comparator circuit is nominally equal to twice the level of any single voltage signal presented by each of the individual sensors;
wherein the comparator circuit presents a negative voltage at a third output of the comparator circuit;
wherein the negative voltage of the comparator circuit triggers the operation of the timing circuit.

12. The contact detection apparatus according to claim 11
wherein the summing circuit comprises a first amplifier, a signal resistor network, a first feedback resistor, a plurality of signal resistors, and a signal node;
wherein the first amplifier, the signal resistor network, the first feedback resistor, the plurality of signal resistors, and the signal node are electrically interconnected;
wherein the first amplifier is further defined with a first positive input, a first negative input, and a first output;
wherein the first feedback resistor is further defined with a third lead and a fourth lead;
wherein each of the plurality of signal resistors is further defined with a signal lead and a common lead;
wherein the first amplifier is a differential amplifier;
wherein the first feedback resistor is a resistor that controls the gain of the first amplifier;
wherein the signal resistor network is a resistive network that feeds the plurality of voltage signals received from the plurality of sensors into the first amplifier;
wherein the signal resistor network comprises the plurality of signal resistors and the signal node;
wherein each of the plurality of signal resistors electrically connects in series between the signal diode of each individual sensor selected from the plurality of sensors and the signal node;
wherein the signal node is a common point with a common electrical potential that electrically connects the plurality of signal resistors with the first amplifier and the first feedback resistor;
wherein each of the plurality of signal resistors has an identical resistance value;
wherein the resistance of each of the plurality of signal resistors equals the value of the first feedback resistor.

13. The contact detection apparatus according to claim 12
wherein the inverting circuit comprises a second amplifier, a first input resistor, and a second feedback resistor;
wherein the second amplifier, the first input resistor, and the second feedback resistor are electrically interconnected;
wherein the second amplifier is further defined with a second positive input, a second negative input, and a second output;
wherein the first input resistor is further defined with a fifth lead and a sixth lead;
wherein the second feedback resistor is further defined with a seventh lead and an eighth lead;
wherein the second amplifier is a differential amplifier;

wherein the first input resistor is a resistor placed in series between the first output of the first amplifier and the second amplifier;
wherein the second feedback resistor is a resistor that controls the gain of the second amplifier.

14. The contact detection apparatus according to claim 13
wherein the comparator circuit comprises a third amplifier, a second input resistor, a third feedback resistor, a first limit resistor, and a Zener diode;
wherein the third amplifier, the second input resistor, the third feedback resistor, the first limit resistor, and the Zener diode are electrically interconnected;
wherein the third amplifier is further defined with a third positive input, a third negative input, and a third output;
wherein the second input resistor is further defined with a ninth lead and a tenth lead;
wherein the third feedback resistor is further defined with an eleventh lead and a twelfth lead;
wherein the first limit resistor is further defined with a thirteenth lead and a fourteenth lead;
wherein the Zener diode is further defined with a Zener anode, a Zener cathode, and a Zener voltage;
wherein the third amplifier is a differential amplifier;
wherein the second input resistor is a resistor placed in series between the second output of the second amplifier and the third amplifier;
wherein the third feedback resistor is a resistor that controls the gain of the third amplifier;
wherein the first limit resistor is a resistor placed in series between the first battery and the Zener diode to limit the flow of electricity through the Zener diode;
wherein the Zener diode presents a reference voltage equal to the Zener voltage;
wherein the Zener voltage of the Zener diode is selected to determine the sensitivity of the contact detection apparatus.

15. The contact detection apparatus according to claim 14
wherein the timing circuit comprises an input lead and an output lead;
wherein the timing circuit generates an output voltage at the output lead;
wherein the output voltage at the output lead initiates the actuation of the announcement circuit;
wherein the announcement circuit actuates the audible and the visible alarm.

16. The contact detection apparatus according to claim 15
wherein the announcement circuit comprises a transistor, a second limit resistor, a plurality of LEDs, and a speaker;
wherein the transistor is further defined with a base and a collector;
wherein the second limit resistor is further defined with a fifteenth lead and a sixteenth lead;
wherein each of the plurality of LEDs is further defined with a LED anode and a LED cathode;
wherein the speaker is further defined with a first speaker lead and a second speaker lead;
wherein the transistor controls the flow of electricity from the first battery into the plurality of LEDs and the speaker;
wherein the operation of the transistor is controlled by the voltage presented at the output lead of the timing circuit;
wherein the second limit resistor is a resistor placed in series between the transistor and the plurality of LEDs;
wherein each of the plurality of LEDs is visibly attached to the uniform;
wherein each of the plurality of LEDs illuminates to generate the visible alarm;
wherein the speaker is a buzzer;
wherein the speaker generates an audible sound as the audible alarm;
wherein the first battery is a chemical device;
wherein the nominal voltage of the first battery is greater than two times the nominal voltage of the third battery;
wherein the second battery is a chemical device;
wherein the nominal voltage of the second battery is greater than two times the nominal voltage of the third battery.

17. The contact detection apparatus according to claim 16
wherein the first conductive network is printed on the exterior surface of the textile using a conductive ink applied with well-known and documented textile printing equipment;
wherein the second conductive network is formed on the interior surface of the textile using a conductive ink applied with well-known and documented textile printing equipment;
wherein the third battery cathode of the third battery electrically connects to the positive conducting web;
wherein the third battery anode of the third battery electrically connects to the second electric ground;
wherein the negative conducting web electrically connects to the first lead of the pull-down resistor;
wherein the negative conducting web electrically connects to the signal anode of the signal diode;
wherein the second lead of the pull-down resistor electrically connects to the second electric ground;
wherein the signal cathode of the signal diode of each of the individual sensor electrically connects to the signal lead of the resistor selected from the plurality of signal resistors associated with the individual sensor;
wherein the common lead of each of the plurality of signal resistors electrically connects to a single point called the signal node;
wherein the signal node electrically connects to the first negative input of the first amplifier;
wherein the signal node electrically connects to the third lead of the first feedback resistor;
wherein the first positive input of the first amplifier electrically connects to the first electric ground;
wherein the first output of the first amplifier electrically connects to the fourth lead of the first feedback resistor;
wherein the first output of the first amplifier electrically connects to the fifth lead of the first input resistor;
wherein the sixth lead of the first input resistor electrically connects to the second negative input of the second amplifier;
wherein the sixth lead of the first input resistor electrically connects to the seventh lead of the second feedback resistor;
wherein the second positive input of the second amplifier electrically connects to the first electric ground;
wherein the second output of the second amplifier electrically connects to the eighth lead of the second feedback resistor;
wherein the second output of the second amplifier electrically connects to the ninth lead of the second input resistor;
wherein the tenth lead of the second input resistor electrically connects to the third negative input of the third amplifier;

wherein the tenth lead of the second input resistor electrically connects to the eleventh lead of the third feedback resistor;

wherein the third positive input of the third amplifier electrically connects to the fourteenth lead of the first limit resistor;

wherein the first battery anode electrically connects to the thirteenth lead of the first limit resistor;

wherein the third positive input of the third amplifier electrically connects to the Zener cathode of the Zener diode;

wherein the Zener anode of the Zener diode electrically connects to the first electric ground;

wherein the third output of the third amplifier electrically connects to the twelfth lead of the third feedback resistor;

wherein the third output of the third positive input electrically connects to the input lead of the timing circuit;

wherein the output lead of the timing circuit electrically connects to the base of the transistor;

wherein the collector of the transistor electrically connects to the first battery cathode of the first battery;

wherein the emitter of the transistor electrically connects to the fifteenth lead of the second limit resistor;

wherein the emitter of the transistor electrically connects to the first speaker lead of the speaker;

wherein the second speaker lead of the speaker electrically connects to the second battery anode of the second battery;

wherein the sixteenth lead of the second limit resistor electrically connects to the LED anode of each of the plurality of LEDs;

wherein the LED cathode of each of the plurality of LEDs electrically connects to the second battery anode of the second battery;

wherein the first battery cathode of the first battery electrically connects to the positive power terminals of the first amplifier, the second amplifier, the third amplifier, the timing circuit, and to the collector of the transistor;

wherein the second battery anode of the second battery electrically connects to the negative power terminals of the first amplifier, the second amplifier, the third amplifier, and the timing circuit;

wherein the second battery anode of the second battery electrically connects to the second speaker lead of the speaker;

wherein the second battery anode of the second battery electrically connects to the LED cathode of each of the plurality of LEDs;

wherein the first battery anode of the first battery electrically connects to the first electric ground;

wherein the second battery cathode of the second battery electrically connects to the first electric ground;

wherein the first electric ground electrically connects to the second electric ground.

18. The contact detection apparatus according to claim 17 wherein the Zener voltage of the Zener diode is selected to be between 180% and 200% of the value of the voltage presented by any individual sensor.

* * * * *